United States Patent [19]

Hayakawa et al.

[11] Patent Number: 5,447,568

[45] Date of Patent: Sep. 5, 1995

[54] CHEMICAL VAPOR DEPOSITION METHOD AND APPARATUS MAKING USE OF LIQUID STARTING MATERIAL

[75] Inventors: Yukihiro Hayakawa, Atsugi; Yasushi Kawasumi, Fujisawa; Kenji Makino, Yokohama; Yuzo Kataoka, Atsugi, all of Japan

[73] Assignee: Canon Kabushiki Kaisha, Tokyo, Japan

[21] Appl. No.: 995,039

[22] Filed: Dec. 22, 1992

[30] Foreign Application Priority Data

| | | | |
|---|---|---|---|
| Dec. 26, 1991 | [JP] | Japan | 3-345057 |
| Dec. 26, 1991 | [JP] | Japan | 3-345066 |
| Dec. 18, 1992 | [JP] | Japan | 4-338799 |
| Dec. 18, 1992 | [JP] | Japan | 4-338800 |
| Dec. 18, 1992 | [JP] | Japan | 4-338803 |

[51] Int. Cl.$^6$ .......................................... H01L 21/20
[52] U.S. Cl. ............................. 118/715; 118/724; 427/576; 437/187
[58] Field of Search .............. 118/715, 724; 437/187; 427/89

[56] References Cited

U.S. PATENT DOCUMENTS

| | | | |
|---|---|---|---|
| 4,154,192 | 5/1979 | Tsubouchi et al. | 118/715 |
| 4,517,220 | 5/1985 | Rose | 118/715 |
| 4,625,678 | 12/1986 | Shioya et al. | 118/724 |
| 4,717,596 | 1/1988 | Barbee et al. | 118/715 |
| 5,091,210 | 2/1992 | Mikoshiba et al. | 427/39 |
| 5,154,949 | 10/1992 | Shindo et al. | 427/253 |
| 5,179,042 | 1/1993 | Mikoshiba et al. | 437/187 |
| 5,180,687 | 1/1993 | Mikoshiba et al. | 437/187 |

FOREIGN PATENT DOCUMENTS

| | | |
|---|---|---|
| 0382987 | 8/1990 | European Pat. Off. . |
| 0419939 | 4/1991 | European Pat. Off. . |
| 0435088 | 7/1991 | European Pat. Off. . |
| 2195663 | 4/1988 | United Kingdom . |
| 9012900 | 11/1990 | WIPO . |

Primary Examiner—R. Bruce Breneman
Assistant Examiner—Felisa Garrett
Attorney, Agent, or Firm—Fitzpatrick, Cella, Harper & Scinto

[57] ABSTRACT

A starting gas feeding apparatus for forming a gaseous starting material from a liquid starting material and feeding the gaseous starting material into a reaction chamber of a CVD apparatus, comprises; a container that holds the liquid starting material, pressure reducing means for reducing the pressure inside the container, and heating means for heating the liquid starting material held in the container; the liquid starting material being boiled.

9 Claims, 15 Drawing Sheets

CHEMICAL VAPOR DEPOSITION METHOD AND APPARATUS MAKING USE OF LIQUID STARTING MATERIAL

BACKGROUND OF THE INVENTION

1. Field of the Invention

The present invention relates to a chemical vapor deposition method and apparatus for forming various deposited films such as metal films, semiconductor films and insulating films used in memory devices such as semiconductor devices and optical magnetic disks or in flat panel display devices. More particularly it relates to a chemical vapor deposition method and apparatus making use of a liquid starting material.

2. Related Background Art

Deposited films formed by chemical vapor deposition method (CVD method) using apparatus therefor (CVD apparatus) can be roughly grouped into metal films, semiconductor films and insulating films.

Of these, in the case of the semiconductor films, a film forming method capable of obtaining uniform films with less faults are desired. As for the insulating films, uniform films are desired as a matter of course and besides a film forming method that can achieve excellent coating properties on step portion is desired. This is because most insulating films are used to insulate wirings from each other in an integrated circuit (IC) or to protect its uneven surface.

In the case of the metal films, a film forming method that can achieve excellent uniformity and coating performance on step portion is also desired as in the case of the insulating films. This is because the metal films are mostly used in wiring materials for ICs and in such instances the coating properties on step portion at the holes thereof are required so that upper and lower wirings can be connected via openings called contact holes or through holes.

FIG. 1 diagrammatically illustrates the prior art CVD apparatus used for such CVD method.

In FIG. 1, reference numeral 403 denotes a reaction chamber formed of quartz or the like, provided therein substrate holders 410 that are disposed in plurality to support thereon a corresponding number of substrates 409 on which films are to be formed. Reference numeral 408 denotes an exhaust pipe, which is connected to a main pump 404 comprise of a mechanical booster pump and an auxiliary pump 405 comprised of a rotary pump and from which the inside of the reaction chamber 403 are evacuated.

As for a gas feeding system, it is provided with a bomb (bubbler) 402 having a bubbling mechanism that bubbles a liquid starting material, a gas pipe 406 through which carrier gas for the bubbling is fed, a valve 401, and a gas pipe 407 through which vaporized starting materials are fed into the reaction chamber 403.

Such a conventional CVD apparatus can make full use of its performance so long as common film formation is carried out, but is sometimes unsuitable for a CVD method that can excellently provide fine structure or form large area films as recently demanded. In other words, conventional apparatus have had some features that they are poor in general-purpose properties, i.e., adaptability to any CVD methods. This problem will be discussed below by giving an example.

Recently, as materials for the wiring of highly integrated semiconductor devices called VLSI or ULSI, aluminum films formed not by sputtering but by CVD have attracted notice. In particular, in CVD methods making use of an organic compound comprising an organoaluminum compound, it is nowadays reported that conditions for deposition greatly differ between an insulator and a conductor and hence selective deposition can be made in which aluminum is deposited only on the conductor or a semiconductor. This selective deposition of aluminum is very useful when fine integrated circuits are fabricated. In particular, in instances in which the ratio of depth to diameter (aspect ratio) of a hole is more than 1, the selective deposition can provide aluminum wiring that can not be realized by the sputtering which is a substitute technique. In the sputtering, disconnection occurs when the hole has a large aspect ratio. The reason therefor will be explained below with reference to FIGS. 2A to 2C. In FIGS. 2A and 2B, reference numeral 201 denotes a monocrystalline silicon substrate; 202, an insulating film such as silicon dioxide film; and 203, a wiring material such as aluminum.

FIG. 2A illustrates how the wiring is formed when the hole has a small aspect ratio, and FIG. 2B how the wiring is formed when the hole has a large aspect ratio of 1 or more.

In the sputtering, a hollow 204 or a void 205 is formed. On the other hand, in the selective deposition by CVD, the hole is completely filled with aluminum 303 as shown in FIG. 2C, and there is a very low probability of disconnection.

In FIG. 3, reference numeral 301 denotes a silicon substrate; 302, an insulating film such as silicon dioxide film; 303, a metallic material such as aluminum deposited by CVD; and 304, wiring of aluminum deposited by sputtering or CVD.

Thus, in the case when the wiring of a fine semiconductor device is fabricated using the CVD apparatus shown in FIG. 1, a carrier gas CGS such as hydrogen, whose pressure is reduced by means of a reducing valve 401, is fed to the bubbler 402. Most of material gases that enable the selective deposition of aluminum are liquid at room temperature, as exemplified by dimethylaluminum hydride (DMAH) and triisobutylaluminum (TIBA). For this reason, the bubbling, i.e. the step of generating bubbles in the bubbler 402 is carried out, so that a mixed gas comprised of the carrier gas and saturated vapor of organoaluminum compound such as DMAH is fed into the reaction chamber. The mixed gas is thermally decomposed on the heated semiconductor substrates 409, and aluminum is deposited on the substrate as a result of its surface reaction with the substrates.

Unreacted gas in the reaction chamber 403 is exhausted outside by means of the main pump 404 and auxiliary pump 405.

However, a change in apparatus environment such that an experimental CVD apparatus that has stably achieved the selective deposition is made up to a mass-production CVD apparatus has caused the problem that the selectivity having been achieved so far is lost.

This results in an increase in faults not only in the case of the metal films but also in the case of the semiconductor films, and results in a lowering of step portion coating properties in the case of the insulating films.

According to a finding made by the present inventors, the poor general-purpose properties is caused by the following reasons, as will be more detailed later, in the constitution of the conventional CVD apparatus.

First, the mixing ratio of the starting material liquid compound and other gas can only be very poorly controlled.

Second, a temperature change in the vicinity of the bubbler causes a change in the mixing ratio of the compound.

Third, residual gases in the bubbler cause a change in the mixing ratio of the compound.

SUMMARY OF THE INVENTION

An object of the present invention is to provide a chemical vapor deposition method and apparatus that can stably form deposited films with a good quality even if there are changes in environmental conditions or changes in operational parameters.

Another object of the present invention is to provide a chemical vapor deposition method and apparatus that has excellent operability and mass-productivity and promises the reduction of production cost of various devices fabricated.

Still another object of the present invention is to provide a chemical vapor deposition method and apparatus that can form deposited films that are uniform over a wide area, cause less unwanted faults and can be formed in good step portion coating properties.

The present invention provides an apparatus for forming a gaseous starting material from a liquid starting material and feeding the gaseous starting material into a reaction chamber of the CVD apparatus comprising;

a container that holds the liquid starting material, pressure reducing means for reducing the pressure inside the container, and heating means for heating the liquid starting material held in the container; the liquid starting material being boiled, and a CVD method making use of the apparatus.

The present invention also provides an apparatus for feeding a starting gas into a reaction chamber with starting gas feeding means and depositing a thin film on a substrate placed in the reaction chamber, wherein;

the starting gas feeding means comprises a heating apparatus comprising a heating member having a plurality of through-holes through which a starting gas is passed, temperature control means that controls the temperature of the heating member and a heater provided in the vicinity of the plurality of through-holes, controlled by the temperature control means; the starting gas being fed into the reaction chamber through the through-holes, and a CVD method making use of the apparatus.

The present invention still also provides a CVD apparatus comprising a container that holds a liquid starting material, a mixing chamber in which a gas of the starting material and other gas are mixed, a rectifier provided between the container and the mixing chamber; the rectifier being provided with gas feeding means comprising a plate member provided with an opening having heating means.

The present invention further provides a CVD apparatus comprising a head from which a starting gas is liberated toward a substrate placed in a reaction chamber; the head having a gas liberating surface at a distance of 10 mm or less from the surface of the substrate, and the gas liberating surface being detachably supported.

The present invention further provides a CVD apparatus for forming a deposited film comprised of the same material in a plurality of film forming regions, wherein;

the plurality of film forming regions are provided between them with means for turning a substrate, the substrate on which a film has been formed in one of the film forming regions is turned by an angle within the range of larger than 0° to smaller than 360°, and thereafter the substrate is placed in other film forming region to further form a film.

DESCRIPTION OF THE PREFERRED EMBODIMENTS

Before specific description of the preferred embodiments of the present invention, technical items discovered to accomplish the present invention will be described below.

When, for example, the selective deposition is carried out by CVD using DMAH and hydrogen, the following two reactions may proceed on the surface of the semiconductor substrate having an insulating film with holes formed therein.

$$2Al(CH_3)_2H + H_2 \rightarrow 2Al + 4CH_4 \tag{1}$$

$$2Al(CH_3)_2H \rightarrow 2Al + 2CH_4 + C_2H_6 \tag{2}$$

In this case, if the reaction proceeds as shown by scheme (1), the selectivity between the semiconductor surface and insulator surface can be ensured. If, however, simple thermal decomposition as shown by scheme (2) proceeds, no perfect selectivity between the semiconductor and insulator can be achieved on some occasions. This is caused by a great influence the molar ratio of DMAH to hydrogen in the mixed gas has on the condition of deposition.

Figure 3:
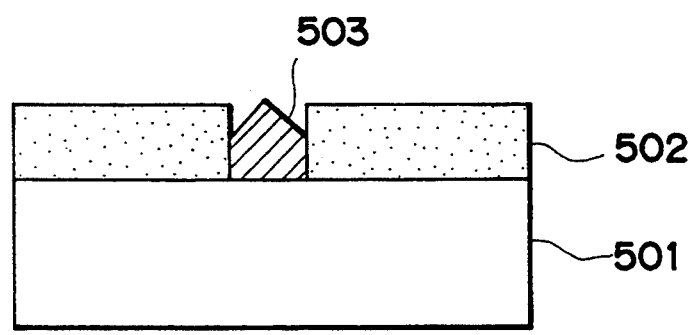
FIG. 3 illustrates the state of a deposited film formed.

To avoid this problem, one may contemplate that hydrogen may be mixed in excess. The feeding of hydrogen in excess to a certain amount brings about the problems that the deposition rate changes depending on the diameter of the hole and that aluminum is buried in the shape of a facet as shown in FIG. 3 to achieve no flat burying. After all, appropriate control of the mixing ratio of DMAH to hydrogen is indispensable for a CVD method that can lead to a commercial success for manufacturers of semiconductors. An optimum mixing ratio will be studied below.

The molar ratio in the case of the mixing of DMAH and hydrogen depends on the ratio of saturated vapor pressure of DMAH to partial pressure of hydrogen at the outlet of a bubbler. That is;

$$n_{DMAH}/n_{H2} = P_{DMAH}/P_{H2} \tag{3}$$

wherein;

$n_{DMAH}$ is a molar number of DMAH fed into a reaction chamber;

$n_{H2}$ is a molar number of H2 fed into the reaction chamber;

$P_{DMAH}$ is a partial pressure (saturated vapor pressure) of DMAH at the outlet of a bubbler; and $P_{H2}$ is a partial pressure of H2 at the outlet of the bubbler.

The $P_{DMAH}$ predominantly depends on the temperature, and is about 1 to 2 Torr at best at room temperature. The $P_{H2}$ can be controlled by a pressure reducing valve, but its control precision depends on the precision of the reducing valve. When it is desired to control the ratio of $P_{DMAH}$ to $P_{H2}$ to be several times, the $P_{H2}$ comes to be ~10 Torr, and hence the reducing valve must control the pressure in the order of several Torr. It, however, is very difficult for any reducing valves on the present technical level to do so.

Figure 4:
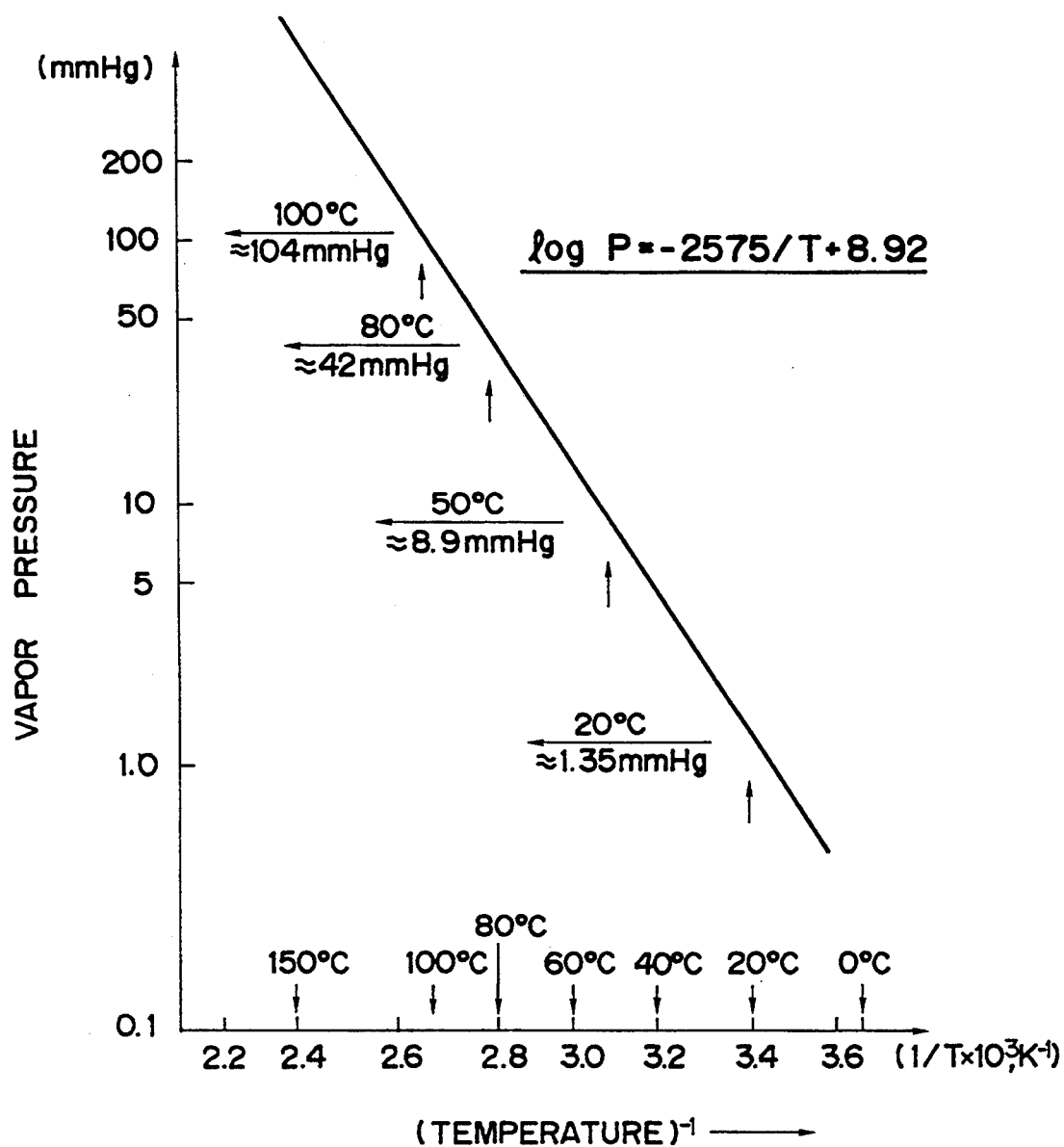
FIG. 4 is a graph to show the relationship between temperature and vapor pressure of a liquid starting material.

As shown in the above (3), the mixing ratio changes depending on the $P_{DMAH}$, and the $P_{DMAH}$, which is merely a saturated vapor pressure, changes depending on temperature. FIG. 4 shows the temperature dependence of DMAH on the saturated vapor pressure.

As shown therein, the $P_{DMAH}$ exponentially changes with respect to temperature. On the other hand, since hydrogen is a gas at room temperature, the $P_{H2}$ does not exponentially change with changes of temperature. In other words, the molar mixing ratio greatly changes with changes of the temperature in the vicinity of the bubbler.

The hydrogen partial pressure $P_{H2}$ at the the bubbler outlet does not coincide with the hydrogen pressure at the bubbler inlet, and has the relationship of:

$$P_{H2}(out) - P_{H2}(in) = c \cdot \rho \cdot h \tag{4}$$

wherein;

$P_{H2}(out)$ is a hydrogen partial pressure at the outlet of the bubbler;

$P_{H2}(in)$ is a hydrogen pressure at the inlet of the bubbler;

$\rho$ is a specific gravity of an organometallic compound;

h is a distance from the tip of a bubbling nozzle to the liquid surface in a bomb; and c is a pressure calculating constant.

In this case, a variable that can be controlled by a regulator is only the $P_{H2}(in)$. Since, however, the value of h becomes smaller as the apparatus is used, the $P_{H2}(out)$ changes. As a result, in order to keep the $P_{H2}(out)$ constant, the $P_{H2}(in)$ must be corrected according to the liquid remaining in the bubbler. However, this is a technique accompanied by a great difficulty because of the structure of the device. As detailed above, the conventional CVD apparatus can not be said to have a satisfactory starting gas controllability for the achievement of wide general-purpose properties and optimum deposition conditions.

According to the present invention, a starting material which is liquid at room temperature as exemplified by the organometallic compound is weighed at the stage where it is liquid, to control the amount of feed. Thereafter, the starting material is formed into particles or evaporated using a vibrator, a Venturi means or the like, heated before the reaction and then fed into the reaction chamber in the form of a gas. This constitution makes it possible to control the mixing ratio of carrier gas to other reaction gas at a high precision without influence by variations in saturated vapor pressure of the starting material.

Thus, according to the present invention, it becomes possible to appropriately carry out all types of CVD methods.

In the cases other than metal films, e.g., in the case of compound semiconductors, the compositional ratio of elements can be well controlled, and it becomes easy to form uniform semiconductor films or band gap controlled semiconductor films. In the case of insulating films, it becomes easy to control x or y in $Si_xO_y$ or $Si_xN_y$, so that it becomes possible to form large-area films having a uniform dielectric constant.

In addition, it becomes possible to feed the starting material in a large quantity, and hence it becomes easy to uniformly form films on a large-area substrate or on a large number of substrates.

As the CVD starting material used in the present invention, a material that is liquid in a use environment of a CVD apparatus is used. More preferably it is a material that is liquid at room temperature, e.g, at 10° to 30° C. It may specifically include trimethylaluminum (TMA), triethylaluminum (TEA), triisobutylaluminum (TiBA), dimethylaluminum hydride (DMAH), diethylaluminum hydride (DEAH), monomethylaluminum hydride (MMAH), triethylindium (TEIn), trimethylindium (TMIn), tIrimethylgallium (TEGa), trimethylgallium (TMGa), dimethylzinc (DMZn), trichlorosilane ($SiHCl_3$), silicon tetrachloride ($SiCl_4$), tetraethyl orthosilicate (TEOS), fluorotriethoxysilane (FOTES), $POCl_3$, $BBr_3$, $Sn(CH_3)_4$ and the like. In particular, organometallic compounds can be preferably used in the CVD method of the present invention because of their relatively low vapor pressure at room temperature and normal pressure and a difficulty in their feeding in a large quantity.

The reaction gas mixed with the above source material may include $H_2$, $O_3$, $NH_3$, NO, $N_2$ and the like. An inert gas such as Ar may optionally be used.

Of course, when compound films are formed or the type of conductivity is controlled, a known doping gas as exemplified by $PH_3$, $AsH_3$, $BF_3$, $B_2H_6$, $SiH_4$ or $Si_2H_6$ may be used in combination.

The reaction chamber used in the present invention may be formed of an insulative reaction tube made of quartz or the like or a reaction tube made of a metal. The reaction tube used may be any of those capable of receiving therein at least one substrate on which a film is to be used.

An exhaust means may include a mechanical booster pump, a rotary pump, an oil-diffusion pump and a turbo-molecular pump, any of which can be used alone or in appropriate combination.

The substrate is held in the reaction chamber by a substrate holding means in such a way that the deposition surface is set upwards, downwards, sideways, diagonally upwards or diagonally downwards.

The CVD apparatus constituted in this way is provided with a gas-feeding means described later.

The deposited film formed by the present invention is a metal film including Al, In, Ga, Zn and Sn films, a compound semiconductor film including GaAs, GaAlAs, InP, ZnSe, Te, Si and SiGe films, an oxide film including SiO, SiON, SnO, InSnO, ZnO and ZnAlO films, of a nitride film including InN, AlN, SiN and BN films.

EXAMPLE 1

Figure 5:
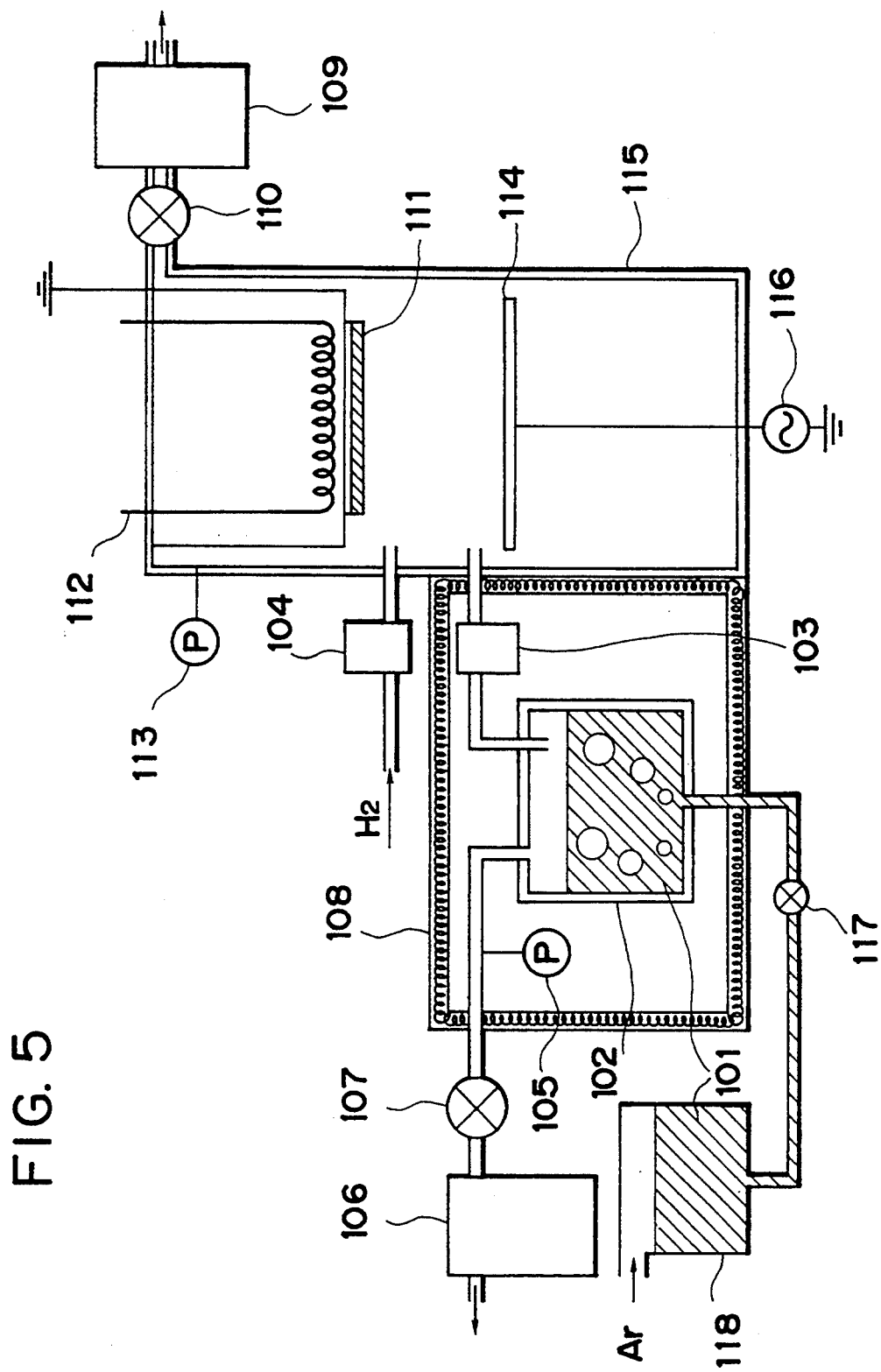
FIG. 5 is a diagrammatic illustration of a CVD apparatus according to Example 1 of the present invention.

FIG. 5 best shows the features of the present invention. In FIG. 5, reference numeral 101 denotes a liquid starting material such as DMAH; 102, a starting material container whose inner wall is formed of an insulating material and which has a sufficient strength; 103 and 104, gas flow rate controllers such as mass flow controllers; 105 and 113, pressure gauges; 106 and 109, each an exhaust means set up in combination of a rotary pump and a mechanical booster pump; 110, a pressure controller such as an automatic pressure controller; 108, a thermostatic chamber having a heating mechanism, provided with a heating element over its whole partition walls; 111, a semiconductor substrate to be treated, such as a silicon wafer; 112, a heater for heating the semiconductor substrate, provided to a substrate support; 114, an opposing electrode for discharging to bring a starting gas into plasma excitation; 115, a CVD reaction chamber; 116, a high-frequency power source; 107 and 117, valves; and 118, a bomb for holding the liquid starting material.

In the container 102, no starting material is poured at first, and the valve is kept shut. First, the inside of the container 102 is well evacuated to a pressure of $1 \times 10$ Torr or less using the exhaust pump 106 and then the valve 107 is closed. Thereafter, the valve 117 is opened, so that the liquid starting material is fed from the container 118 into the container 102 via the valve 117. The system that embraces the container 102 and the mass flow controller 103 is set in the thermostatic chamber 108, and hence the liquid starting material can be boiled at a given temperature in accordance with the reduced inner pressure whose environment is kept at any desired temperature. When, for example, DMAH is used as the starting material, the temperature in the thermostatic chamber should be kept at 75° C. to 80° C. Particularly when the temperature is kept at 80° C. and the DMAH is used as the starting material, substantially 100% of the inside of the container 102 comes to be held by DMAH vapor, and gas pressure comes to be about 42 Torr (see FIG. 4).

As for the pressure inside the reaction chamber 115, the reaction chamber 115 is evacuated using the exhaust pump 109 and is pressure is kept at 1 to 3 Torr, which is a proper deposition pressure, by means of the pressure control valve 110. The mass flow controller 103 may be comprised of a known device, and should be selected from those having a maximum controlled flow rate of about 200 sccm. As shown in FIG. 5, the DMAH and hydrogen gas are fed into the reaction chamber 115 at a flow rate of 200 sccm or less via the mass flow controller 103 and at a flow rate of 20 slm or less via the mass flow controller 104, respectively. When, for example, the DMAH gas and hydrogen gas are used as a mixed gas of starting gases and their partial pressure ratio is set by controlling the flow rate using the mass flow controllers, the ratio of $DMAH/H_2$ can be arbitrarily set within the range of from 1/10 to 1/100. The total flow rate of the mixed gas may preferably be controlled to be about 2 to 20 slm.

Figure 2A:
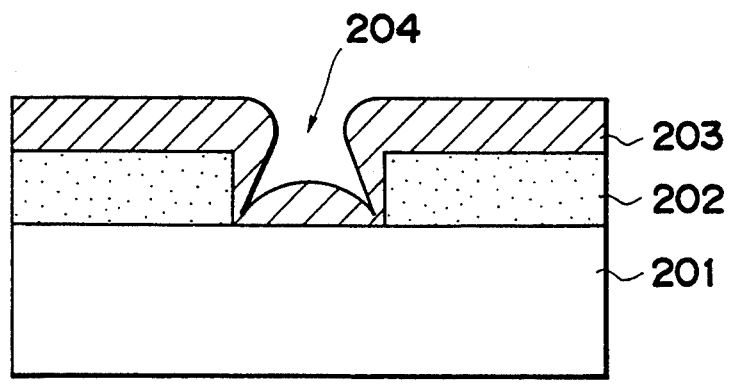
FIGS. 2A to 2C illustrate the states of deposited films formed.
Figure 2B:
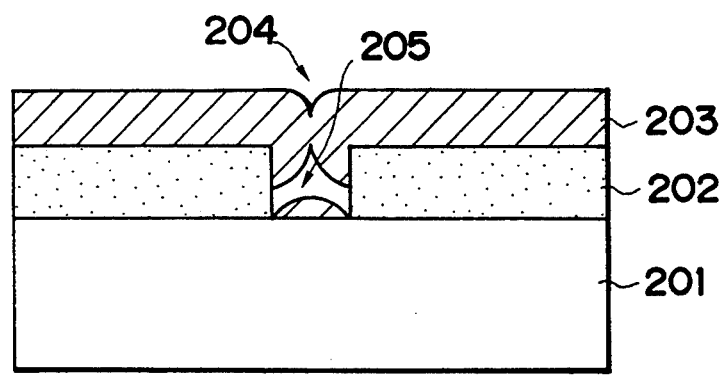
Figure 2C:
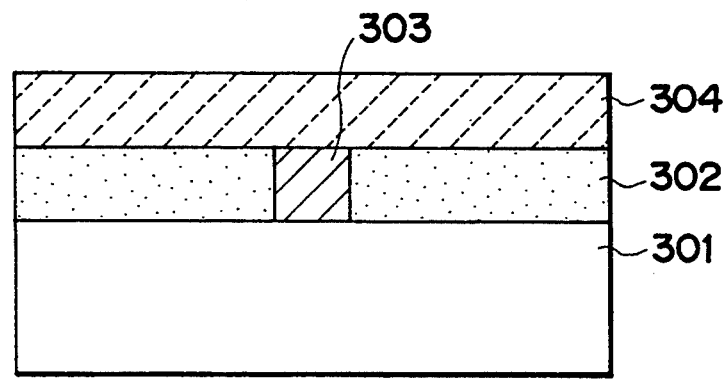

The starting gases thus fed into the reaction chamber at a proper mixing ratio come to the surface of the semiconductor substrate 111 heated to 200° to 300° C. by means of the heater 112, and undergo thermal decomposition there, so that the desired reaction product is deposited on the semiconductor substrate. This reaction is the reaction of the scheme (1) previously described, giving a good selectivity between the conductor and insulator, and thus the state of burying as shown in FIG. 2C can be formed.

In the CVD utilizing the reaction between DMAH and hydrogen, non-selective growth can also be made by generating plasma across the semiconductor substrate 111 and the electrode 114 by excitation using a high-frequency power source 116 (i.e., plasma CVD). By this plasma CVD, the metal deposited film as shown in FIG. 2C can be continuously formed in the same reaction chamber.

Each component part is provided with an interlock system as a stabilizing system for improving safety and carrying out good deposition.

Stated specifically, the system is a monitor that detects the liquid level in the container 118. A means by which the deposition is stopped when the liquid therein becomes short and its level becomes lower than a certain level is attached to the container 118. It is also possible to put the deposition time in a memory.

The thermostatic chamber 108 is also provided with a means for preventing overheat using a temperature sensor.

There is also provided a system by which the temperature and pressure inside the container are detected and the feeding of starting gas into the reaction chamber is stopped when the vapor pressure of the starting material becomes lower than a given value, or the valve 107 is opened when it becomes more than another given value.

Other systems are also provided, e.g., a system for detecting abnormal discharge of plasma inside the reaction chamber and stopping the operation, and a system for detecting abnormal pressure inside the reaction chamber and stopping the operation.

Figure 1:
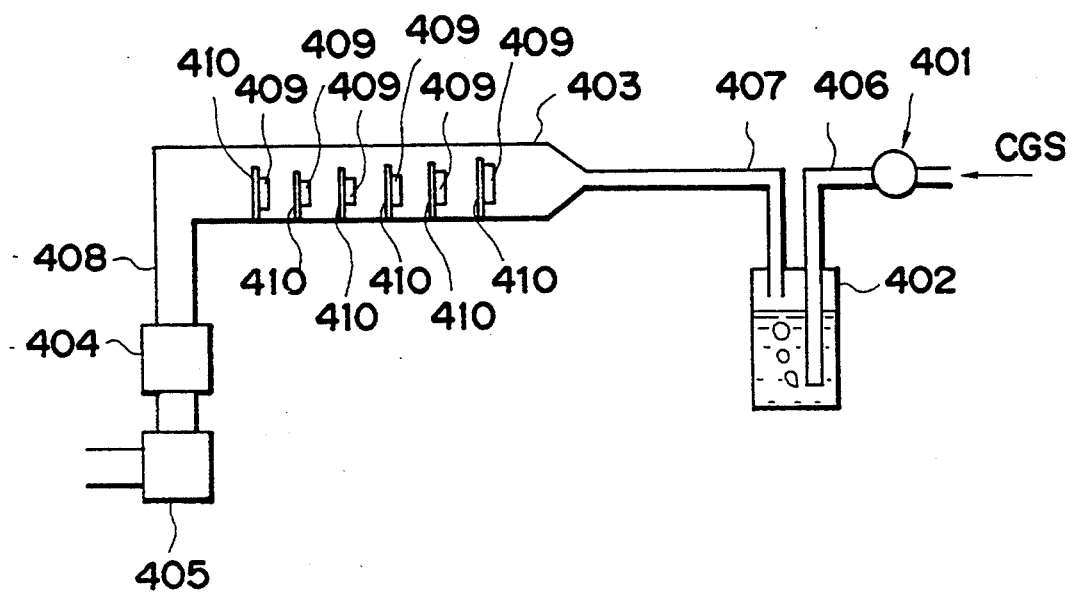
FIG. 1 is a diagrammatic illustration of a conventional CVD apparatus.

The present invention can be applied not only to the CVD apparatus having the reaction chamber of sheet-by-sheet treatment as shown in FIG. 5 but also to a CVD apparatus having a reaction chamber of multi-sheet treatment according to a hot-wall system as shown in FIG. 1.

In the present invention, the exhaust systems 106 and 109 are separately provided in the apparatus shown in FIG. 5. Alternatively, the end of the valve 107 may be inserted between the valve 110 and the exhaust system 109 so that the exhaust system can be omitted.

In the apparatus shown in FIG. 5, two-system gas lines are connected to the container 102. Alternatively, the line having the exhaust system 106-107 may be omitted so that the inside of the container 102 can be evacuated through the reaction chamber 115 by means of the exhaust system 109.

As described above, as a method of feeding the liquid starting material for the CVD apparatus, the starting material vapor comprised of substantially 100% of the starting material is fed into the reaction chamber. Hence, it is weighed separately from other reaction gas and sent to the reaction chamber, where their mixing ratio can be maintained at a proper value and in a high precision, and also can be stably fed into the reaction chamber. Thus, it becomes possible to obtain a good film quality and film configuration of the deposit of the reaction product.

Incidentally, in an instance in which the saturated vapor pressure of the liquid starting material is so low that the deposition rate is determined by the amount of feed of the starting material, it is known to use the following apparatus as a method of improving feed efficiency of the starting material.

Figure 6:
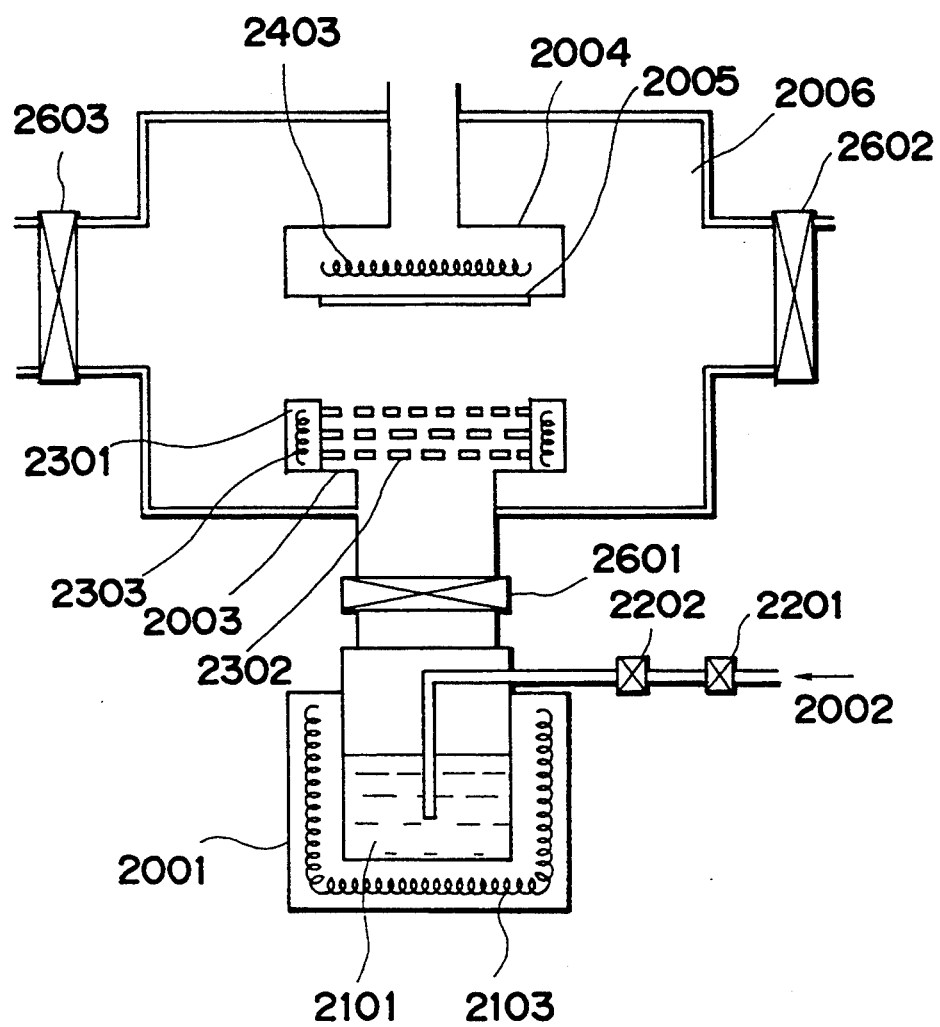
FIG. 6 is a diagrammatic illustration of a conventional CVD apparatus.

FIG. 6 is a diagrammatic illustration of a CVD apparatus used to form an aluminum thin film, which is disclosed in Japanese Patent Application Laid-open No. 2-38569.

A carrier gas 2002 is blown into a liquid starting material 2101 through a valve 2201 and a mass flow controller 2202, and a mixed gas of the carrier gas and starting gas is fed into a reaction chamber 2006. To the inlet of the mixed-gas, a rectifier 2003 is fitted so that the gases can be uniformly fed to the surface of a substrate. This rectifier makes it possible to increase the vapor pressure of the starting gas by heating a starting material tank 2001 by means of a heating mechanism 2103 when the liquid source material 2101 has a small vapor pressure. This rectifier 2003 is comprised of several rectifying plates 2302 for making gas flow uniform and a cylindrical frame 2301 to which the rectifying plates are fixed, and the cylindrical frame 2301 is provided with a built-in heater 2303. The heating mechanism 2103 of the starting material tank is set at a temperature high enough to increase the vapor pressure and also low enough not to cause the starting gas to decompose, e.g., about 50° C. when an organometallic compound, triisobutylaluminum (TIBA), is used as the starting material. The heating mechanism belonging to the rectifier 2003 is set at about 230° C., which is a temperature at which the aluminum thin film is most fittingly formed.

Then, a substrate 2005 such as a silicon wafer fitted to a substrate holder 2004 is heated to about 400° C. by means of a heating mechanism 2403, and as a result of thermal decomposition reaction of the mixed gas fed thereto the aluminum thin film is formed on the substrate.

Reference numerals 2601, 2602 and 2603 denotes respectively a valve 2601 for introducing the mixed gas, a valve 2602 for evacuation and a gate valve 2603 from which the substrate is carried in or taken out.

However, a change in apparatus environment such that an experimental CVD apparatus that has stably achieved the selective deposition is made up to a mass-production CVD apparatus has caused the problem that the selectivity having been achieved so far is lost.

This results in an increase in faults not only in the case of the metal films but also in the case of the semiconductor films, and results in a lowering of step portion coating properties in the case of the insulating films.

According to a finding made by the present inventors, these are caused by an insufficient starting gas temperature control made by the heating system.

EXAMPLE 2

This Example is an improvement of the rectifier 2003 shown in FIG. 6, and has a structure that can form a gas flow having a uniform temperature distribution.

In the prior art previously described, the heater 2303 externally provided was used in order to maintain the temperature of the rectifier 2003 at, e.g., 80° C.

Figure 7:
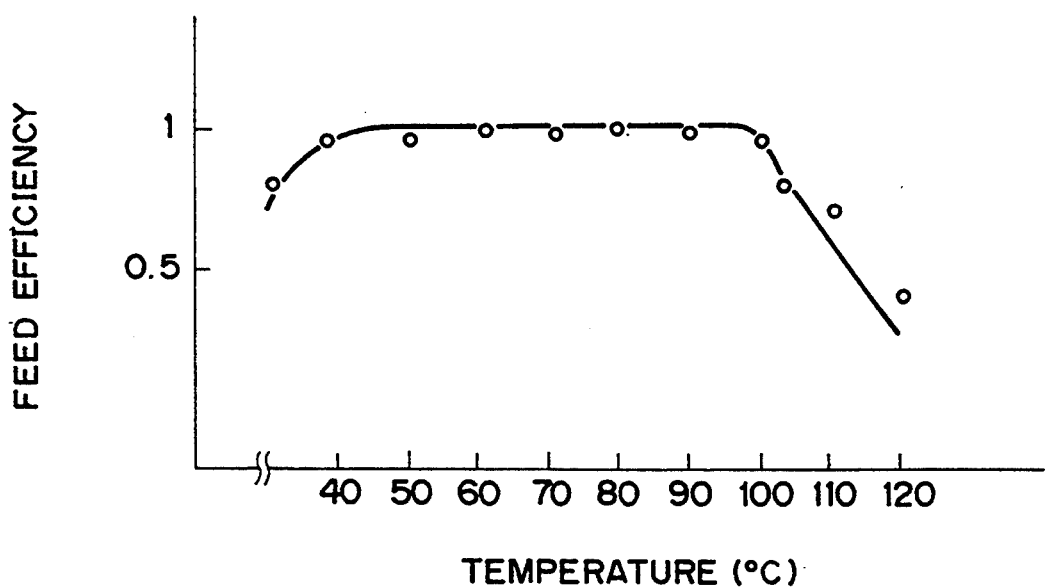
FIG. 7 is a graph to show the relationship between starting gas temperature and feed efficiency.

FIG. 7 is a graph to show the relationship between the temperature inside the rectifier 2003 and the feed efficiency of the starting gas formed by evaporation. When DMAH is used as the liquid starting material, the liquid starting material is evaporated by substantially 100% if the temperature inside the rectifier is not higher than 100° C. and not lower than 40° C., and fed into the reaction chamber. If the temperature is lower than 40° C., the material tends to be incompletely evaporated to remain as liquid droplets in the rectifier. If the temperature is higher than 100° C., about 0.1% of the starting gas undergoes decomposition inside the rectifier to cause deposition of Al. The Al deposited there may cause clogging of openings of a quartz plate to prohibit flow of the starting gas, resulting in a great decrease in feed efficiency for the rate of decomposition of as small as 0.1%.

Figure 8:
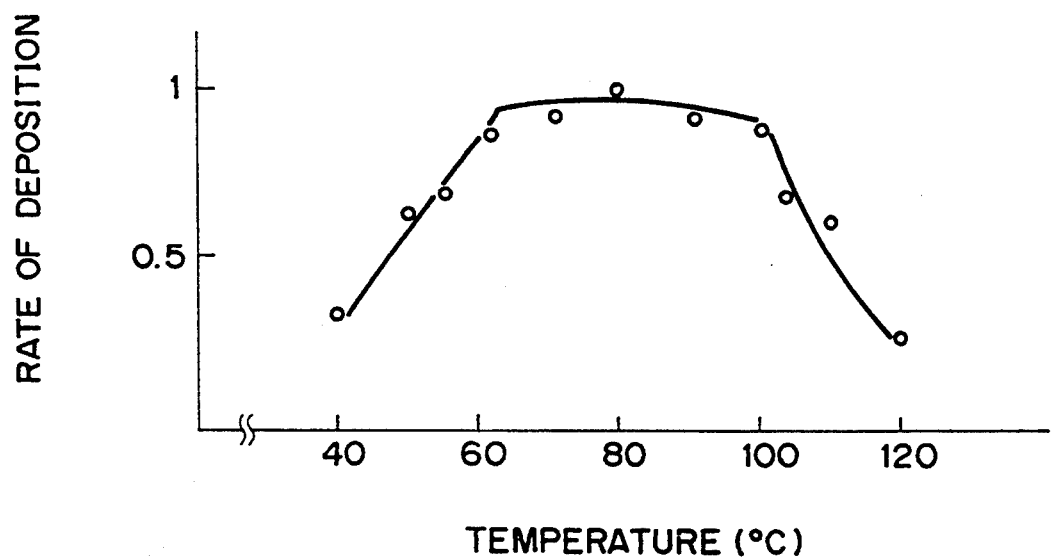
FIG. 8 is a graph to show the relationship between starting gas temperature and deposition rate.

What influence this fact has on the film formation is shown by FIG. 8. FIG. 8 shows the relationship between the temperature inside the rectifier and the rate of deposition of an Al film.

In the CVD apparatus shown in FIG. 6, the flow rate of liquid DMAH and the flow rate of $H_2$ gas were measured to adjust them so as to be 1:1 in molar ratio, and the rate of deposition of Al on a monocrystalline silicon wafer was measured. Results of the measurement are plotted with respect to the temperature of the rectifier.

In FIG. 8, the rate of deposition of Al is indicated as a relative value assuming as 1 the rate of deposition observed when the temperature inside the rectifier is set at 80° C. As is clear from FIG. 8, when the temperature is lower than 60° C., the vapor pressure of DMAH becomes so excessively low that the reaction is retarded to cause an abrupt decrease in the rate of deposition. On the other hand, when the temperature is higher than 100° C., the rate of deposition can not be high because of a decrease in feed efficiency.

This means that precisely controlling the temperature inside the rectifier is important for the process in which CVD is carried out after the liquid source material has been evaporated.

It has been also made clear that this temperature control must be precisely made while the gas is being flowed.

Figure 9:
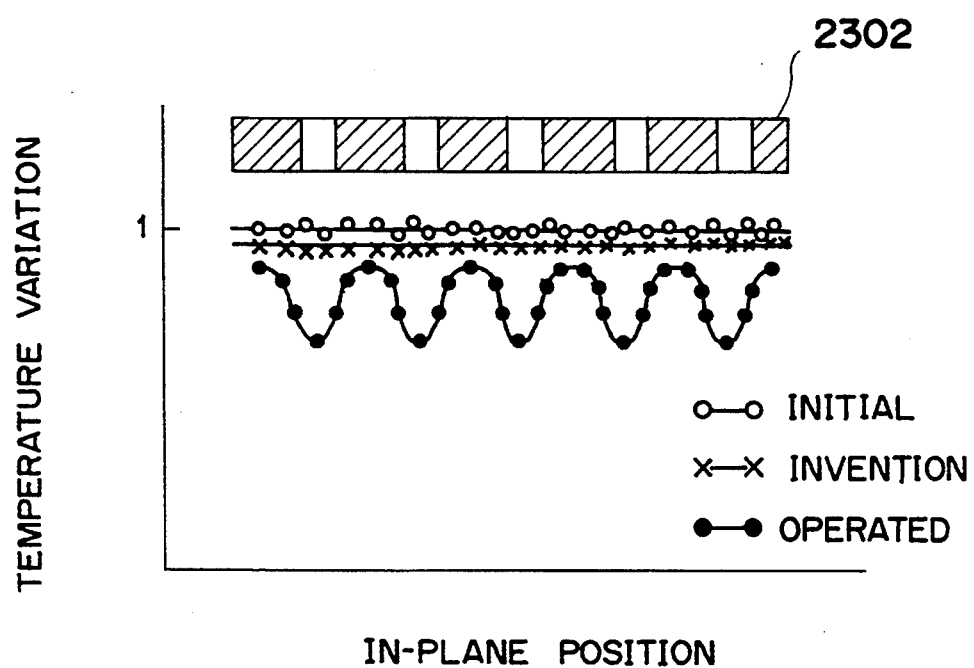
FIG. 9 is a graph to show temperature distribution of a starting gas at the in-plane position of a rectifying plate.

FIG. 9 is a graph to show an in-plane temperature distribution of a rectifying plate 2302 provided in the rectifier 2003.

White dots in FIG. 9 represent a temperature distribution of the rectifying plate, observed when the gas is not flowed (an initial state), and black spots represent a temperature distribution thereof observed when the gas is being flowed (an operated state). As is clear from FIG. 9, since the gas flows without stagnating in the vicinities of the openings of the rectifying plate 2302, the temperature is considerably lower than the temperature initially set. That is, since the heat is taken away in the vicinities of the openings because of successive feeding of fresh gas, the temperature is dropped there. Such an in-plane temperature distribution varies depending on the size of the openings in the rectifying plate. In general, the larger the openings are and therefore the larger the proportion of the openings to the rectifying plate is, the larger the in-plane temperature distribution is.

Since the rectifying plates are mainly heated by heat conduction from its end to which a heating element is fixed, the temperature distribution occurs at the in-plane of each rectifying plate, and this adversely affects the quality distribution of the film formed. Moreover, a great temperature change occurs in the rectifying plates particularly before and after the feeding of gas. At this time, the temperature distribution becomes more non-uniform between the rectifying plates. The cylindrical frame having a built-in heater has a higher temperature than the rectifying plates and hence tends to cause thermal decomposition of gas or deposition of Al. In some cases, depending on gas species, the optimum temperature of the rectifying plates should be relatively low, e.g., about 80° C., in order to prevent the thermal decomposition of gas. Such a low temperature, however, makes it more difficult to control the temperature.

In particular, even though a plurality of rectifying plates are provided, the heating is controlled on the plurality of rectifying plates as a whole, and hence the rectifying plate on the side near to the substrate holder is affected by radiation of substrate heating. This makes it still more difficult to control the temperature.

Figure 10:
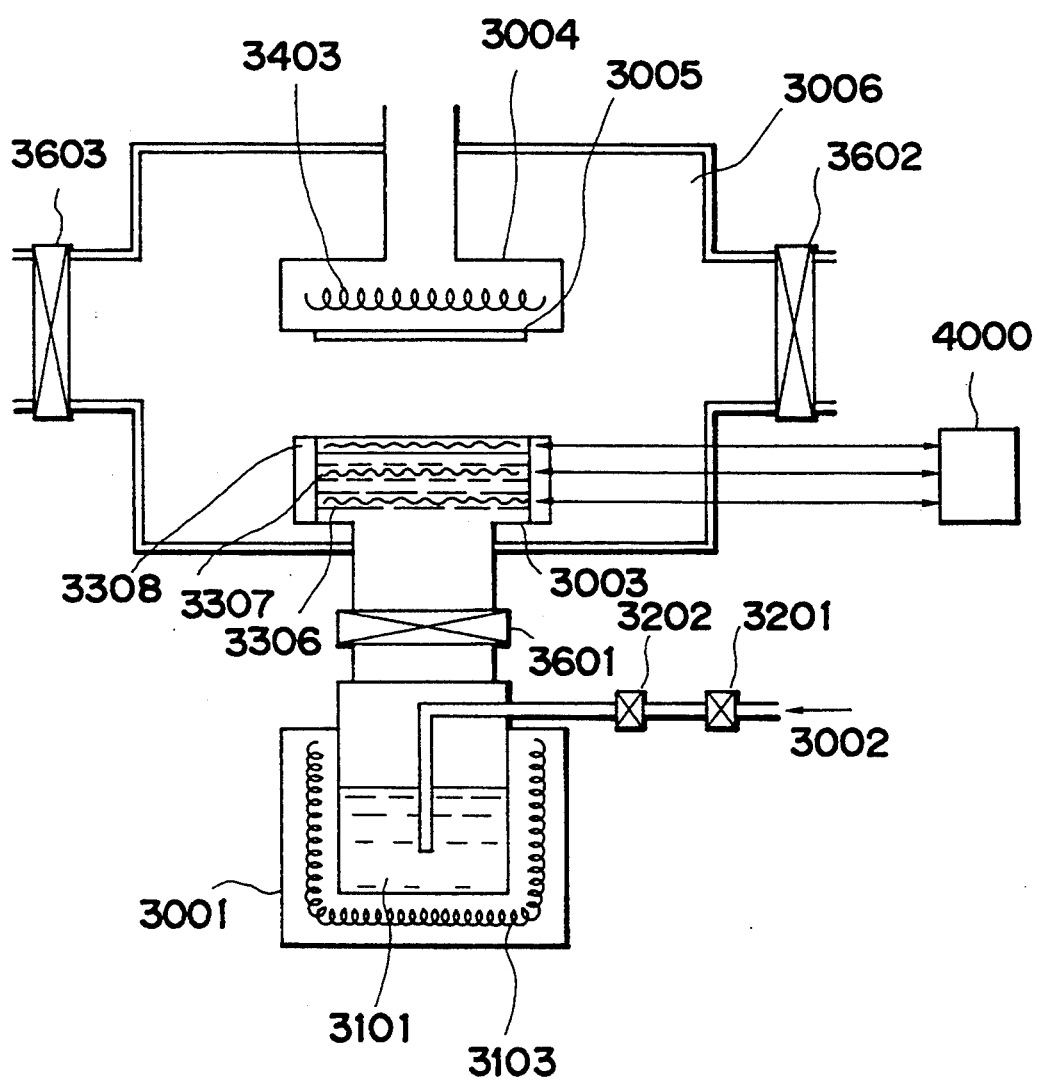
FIG. 10 is a diagrammatic illustration of a CVD apparatus according to Example 2 of the present invention.

FIG. 10 illustrates a second Example of the present invention. What is greatly different from the prior art shown in FIG. 6 is that a rectifier 3003 is so set up as to carry out rectification while the mixed gas is heated when the mixed gas containing the starting material is fed into the reaction chamber 3006.

The rectifier 3003 is comprised of a heater 3307 as a heating element, a heating rectifying plate 3306 serving as a heating member having a built-in temperature sensor, and an fixing frame 3308 of the heating rectifying plate. The gas is heated when passed through small openings arranged in the heating rectifying plate 3306, and then led to the side of the reaction chamber 3006. The heating rectifying plate should preferably be provided in plurality as shown in FIG. 10. The fixing frame 3308 is so set up that it mechanically supports the heating rectifying plate 3306, at the same time intercepts the gas from going around the fixing frame and also has a terminal through which the heater 3307 of the heating rectifying plate 3306 is electrified.

In FIG. 10, reference numeral 4000 denotes a temperature control system, which controls the quantity of current applied to the heater on the basis of signals outputted from a temperature sensor provided to the rectifying plate together with the heater 3307 as will be described layer.

In the case when the rectifying plate is provided in plurality, each heater and temperature sensor should be provided independently for each rectifying plate so that its fine adjustment can be made independently.

Figure 11:
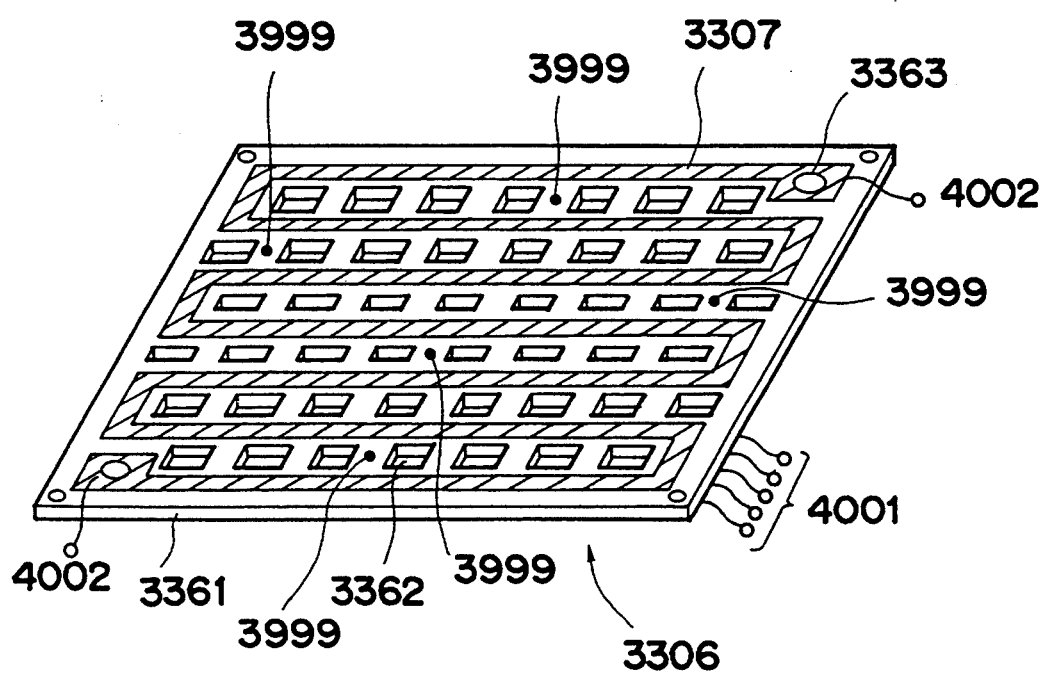
FIG. 11 is a diagrammatic illustration of the structure of a rectifying plate used in the present invention.

This heating rectifying plate 3306 is has a structure as shown in detail in FIG. 11. That is, a thick film of C, Cu, Ni, Ag, Pd or a high-melting metal such as Mo, Ta or W is formed as the heater 3307 on a ceramic substrate 3361 such as a boron nitride, alumina, zirconium, magnesia or cordierite substrate. To the both ends of the heater, terminal 3363 for power supply is provided, and is connected inside the fixing frame 3308 shown in FIG. 10. Reference numeral 3999 denotes temperature sensors provided arbitrarily in the area of the substrate. The ceramic substrate 3361 should be formed of boron nitride, having a large thermal conductivity. The upper layer of the heater 3307 thus formed is covered with an insulating ceramic material for the purpose of protection. Through-holes are further arranged for the purpose of gas rectification. In this example, the through-holes are made to have a size distribution so that the conductance at the outskirts where the flow velocity decreases can be increased.

Using this heating rectifying plate in plurality, plates having through-hole size distributions different from each other can be used so that the gas rectifying action can be improved.

A square or rectangular rectifying plate is shown in FIG. 11. It is also possible to symmetrically arrange the through-holes in a disklike substrate. Of course, a variety of heater patterns can be designed so long as the vicinities of the through-holes can be heated.

Reference numeral 4001 denotes external terminals of the temperature sensors, and 4002, external terminals of the heater. These are connected to the temperature control system 4000.

Figure 12:
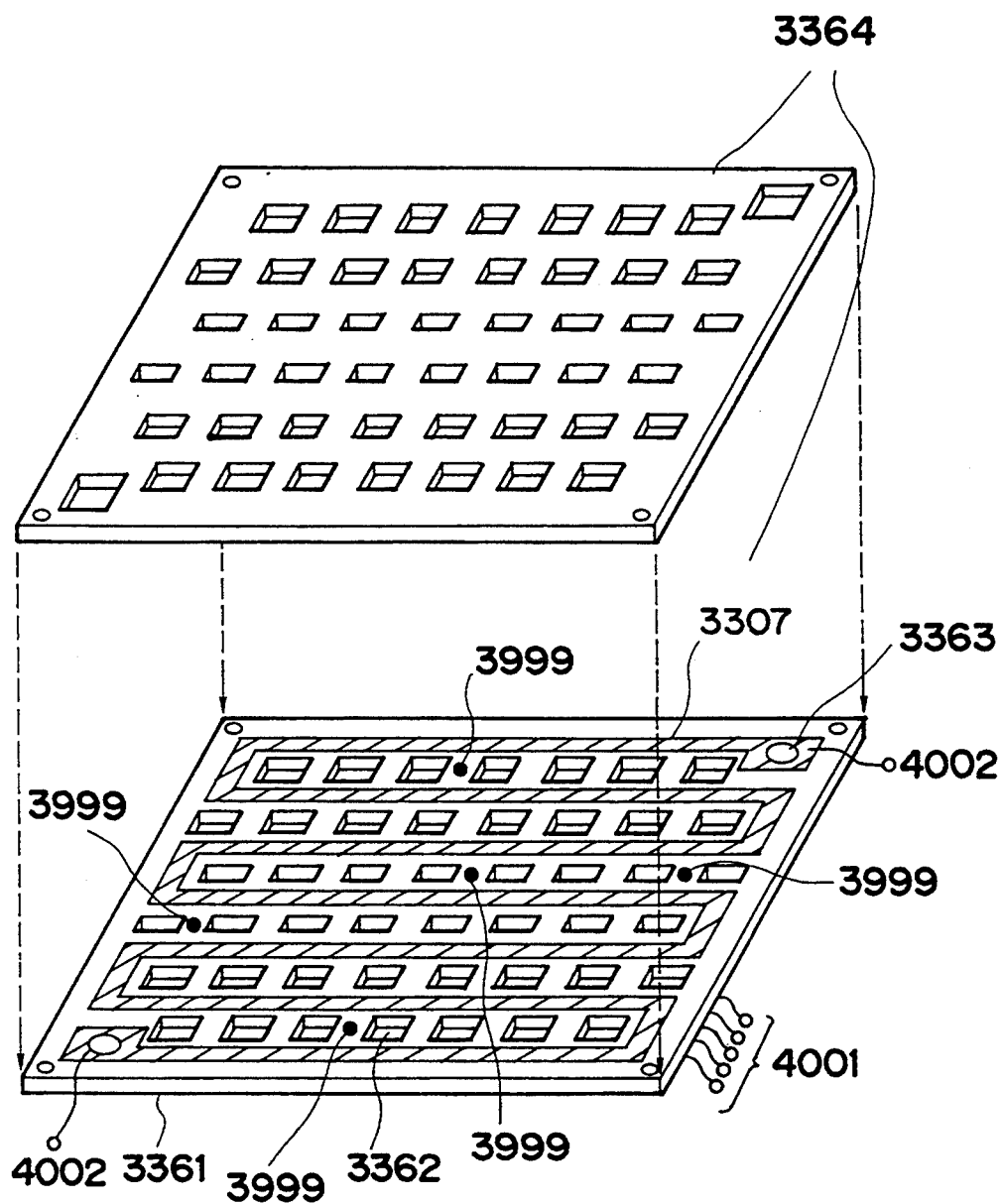
FIG. 12 is a diagrammatic illustration of the structure of another rectifying plate used in the present invention.

As another embodiment, as shown in FIG. 12, another ceramic substrate 3364 may be overlaid so that the heater is completely built in to give a top-and-bottom symmetrical structure.

The present Example thus constituted can achieve a uniform in-plane temperature distribution as shown by x marks in FIG. 9 previously given.

It also can achieve an improvement in temperature uniformity of the rectifying plate and also an improvement in the quality and thickness distribution of the film formed by CVD.

It still also can expand the scope of optimum conditions of gas heating temperature, flow rate and so forth, and at the same time can improve reproducibility to give films with a good coverage.

In addition, the use of the heating rectifying plates in a multiple construction to make individual temperature control expands the scope of adaptation for liquid starting material gas species used, the state of evaporation and so forth. It also brings about an increase in feed efficiency of the liquid starting material and an improvement in film deposition rate.

These effects can be great particularly when liquid source materials with a low saturated vapor pressure as in the organometallic compounds are used.

EXAMPLE 3

Figure 13:
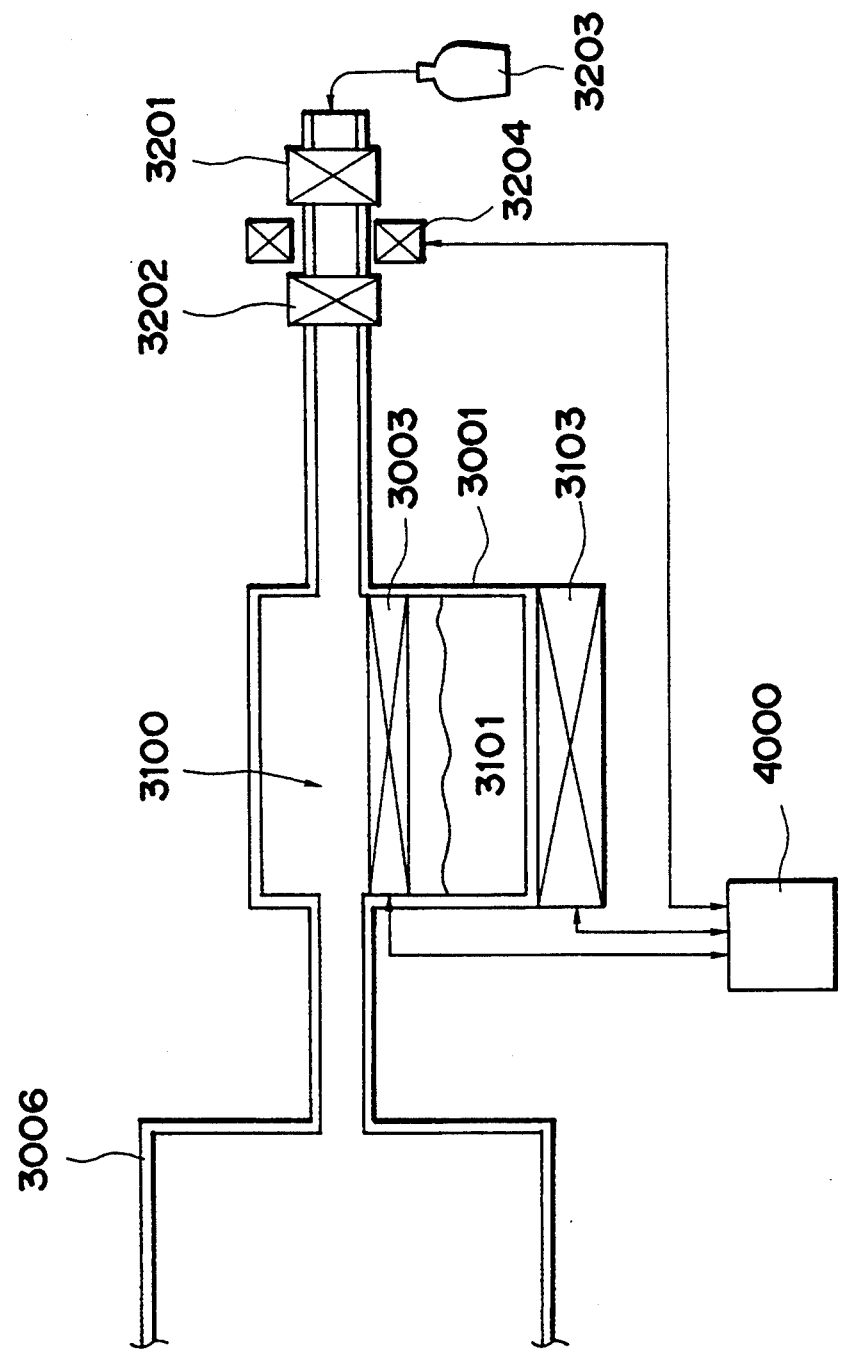
FIG. 13 is a diagrammatic illustration of a CVD apparatus according to Example 3 of the present invention.

FIG. 13 is a diagrammatical illustration of a gas feeding system of the CVD apparatus according to this Example of the present invention.

Reference numeral 3006 denotes a reaction chamber, to which the substrate holder, the heater for heating substrates and so forth are provided in the same manner as in the embodiments previously described.

This reaction chamber 3006 is provided thereto with a mixing chamber 3100 via a connecting pipe, and the mixing chamber 3100 is provided beneath it with the same rectifier 3003 as in the Example previously described. Further beneath the rectifier, a starting material tank 3001 for holding a liquid starting material 3101, fitted with a heater 3103, is provided. The starting material tank is formed of quartz or a fluorine-treated insulating material.

On the side opposite to the reaction chamber side, the mixing chamber 3100 is connected to a carrier gas feeding means via a connecting pipe.

This carrier gas feeding means contains a mass flow controller 3202, a valve 3201 and a gas bomb 3203, and is further provided with a heater 3204.

This apparatus is operated as described below.

The liquid starting material 3101 kept in the source material tank 3001 is heated with the heater 3103 to generate vapor therefrom. The heating temperature at this time is selected from temperatures that can give a vapor pressure as large as possible without little causing decomposition of the starting material 3101. In the case of DMAH, the temperature may preferably be 40° C. to 100° C. The pressure inside the mixing chamber 3100 is controlled to be about 0.5 to 200 Torr according to the conductance of the connecting pipes. As for the starting material tank 3001, its inside pressure is so made as to be 0.5 to 500 Torr by adjusting the size and density of the openings in the rectifying plate of the rectifier 3003. Stated specifically, the pressure inside the tank 3001 is made equal to the saturated vapor pressure of the starting material.

Then, Ar or $N_2$ as a carrier gas is fed from the gas bomb 3203 into the mixing chamber at a temperature adjusted to 30° to 150° C., and preferably 40° to 100° C., using the heater 3204.

Temperature of the starting gas generated by evaporation is precisely controlled by means of the rectifier 3003 in the manner as in the embodiment previously described.

Temperature of the gas in the rectifier 3003 is controlled to be 40° to 100° C., and preferably 60° to 100° C.

Such temperature control of each heater is carried out by means of the temperature control system 4000. In particular, controlling the temperatures of the rectifier 3003 and heater 3103 makes it possible to highly precisely control the rate of feed of the material gas making reference to a condition equation ($pV = nRT$).

In the case when the selective deposition is carried out using DMAH as the starting gas, not an inert gas but $H_2$ is used as the carrier gas.

EXAMPLE 4

This Example is an embodiment in which the part (a head) through which the mixed gas containing the starting gas is fed into the reaction chamber has been improved.

In Example 1 or 3, the starting gas is introduced from a lateral position of the reaction chamber. In Example 2, the starting gas is introduced from the rectifier toward the substrate in the reaction chamber.

Figure 14:
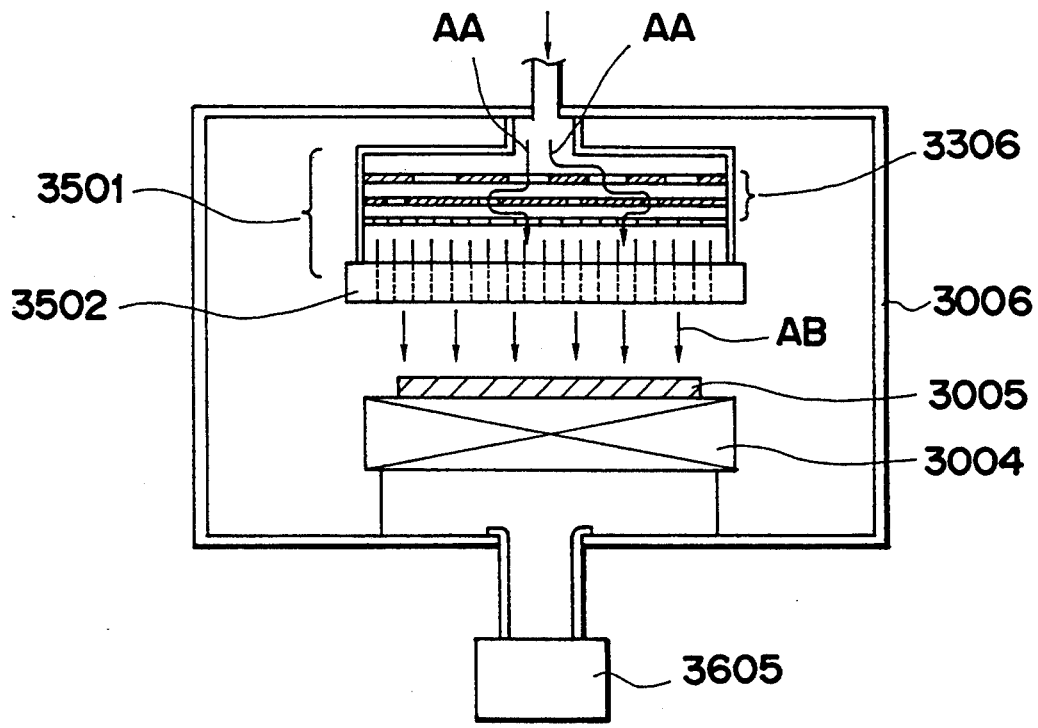
FIG. 14 is a diagrammatic illustration of a CVD apparatus according to Example 4 of the present invention.
Figure 15:
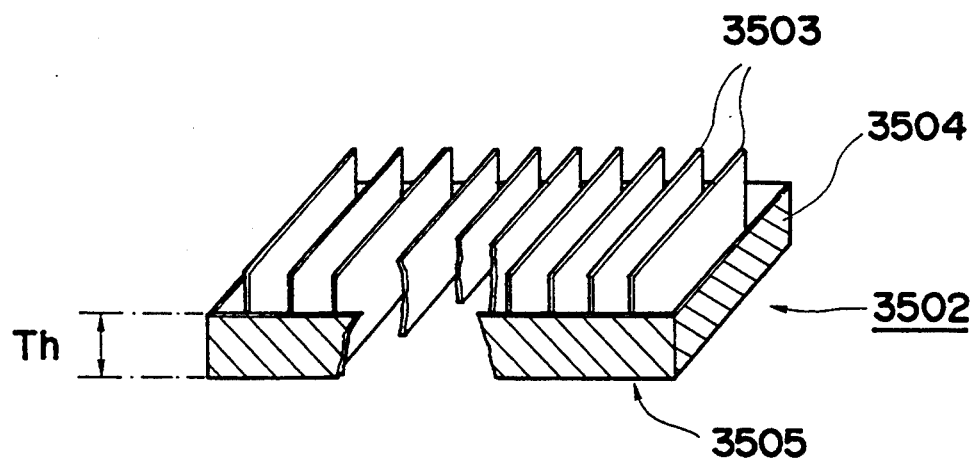
FIG. 15 is a diagrammatic illustration of a detachable head used in the present invention, which is partially cut away to make the description easy to understand.

Now, in the present Example, the starting gas is vertically emitted to the substrate surface through means of a head assembly as shown in FIG. 14 so that the deposited film can be obtained from the starting gas in a much higher yield.

As shown in FIG. 14, the head assembly 3501 is provided with three rectifying plates 3306 made of quartz, in the same manner as in Examples 2 and 3. The openings in these plates are so made that they do not overlap each other, to set up communicating paths through which the gas introduced thereto mienders as shown by arrows AA in the drawing.

Beneath the rectifier, a dispersion head 3502 is detachably provided.

The dispersion head 3502 is comprised of a holder that is attached to or detached from the head assembly 3501, and a number of plate members 3503.

In this head 3502, the distance between the gas blow-out surface 3505 of the head and the deposition surface of the substrate, 3005 should be not more than 10 mm, preferably 1 to 10 mm, and more preferably 2 to 5 mm so that the starting gas having been fed into the reaction chamber 3006 can be utilized in a good efficiency to form a deposited film on the substrate. The holder 3504 should be made to have a thickness Th of 1 to 20 mm, and more preferably 3 to 17 mm.

The plate members 3503 and holder 3504 of the head 3502 is made of stainless steel or silicon carbide.

According to the present Example, the starting gas is kept at a constant temperature by means of the rectifier 3306, is uniformly dispersed by plates 3503 of the head which serve as a gas dispersion means, and reaches as shown by arrows AB the surface of the substrate 3005 placed on the substrate holder 3004 having a heater.

Thus, the proportion of the starting material exhausted and recovered through an exhaust system 3605 decreases, and hence the safety system that prevents gas from reacting in the exhaust system can be set up in a small scale.

Since the blow-out surface 3505 of the head assembly stands adjacent to the substrate holder 3004, it is possible that the head 3505 receives the radiation of the heat for deposition, the temperature of the blow-out surface 3505 of the head reaches a deposition temperature and a deposited film is formed there. Since, however, the head 3502 is provided detachably in a known mechanical construction, its maintenance can be made with ease. To give an example, when DMAH is used as the starting material, a head made of silicon carbide is used as the head 3502. Then, with repetition of deposition steps, Al is sometimes deposited to the gas blow-out surface in a thickness of 10 to 100 Å. On this occasion, the head 3502 can be readily detached to etch away the deposited Al.

EXAMPLE 5

Figure 16:
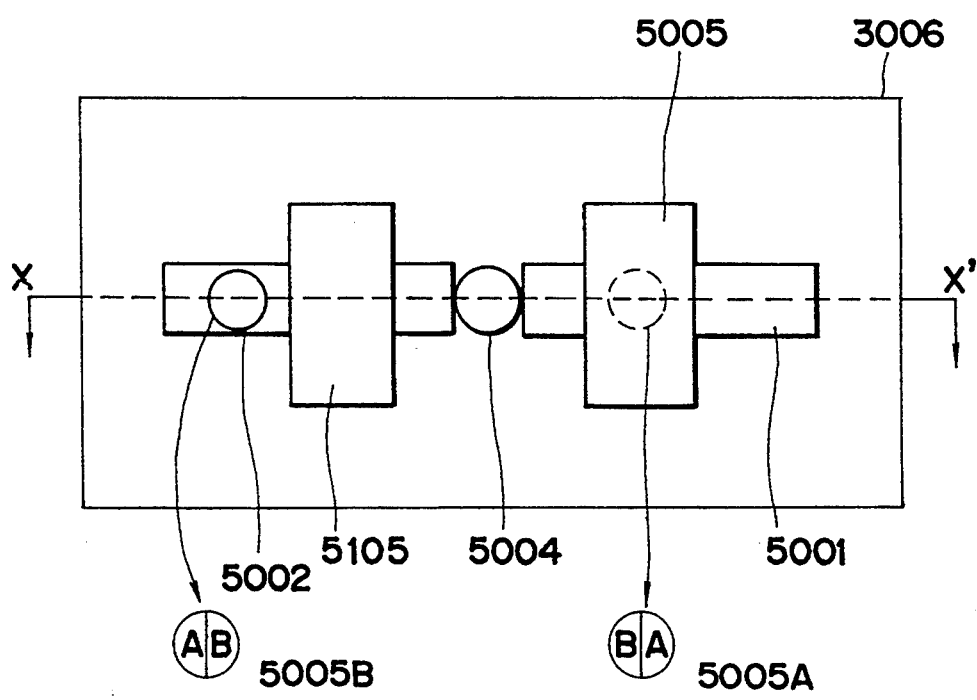
FIG. 16 is a diagrammatic top plan view of a CVD apparatus according to Example 5 of the present invention.
Figure 17:
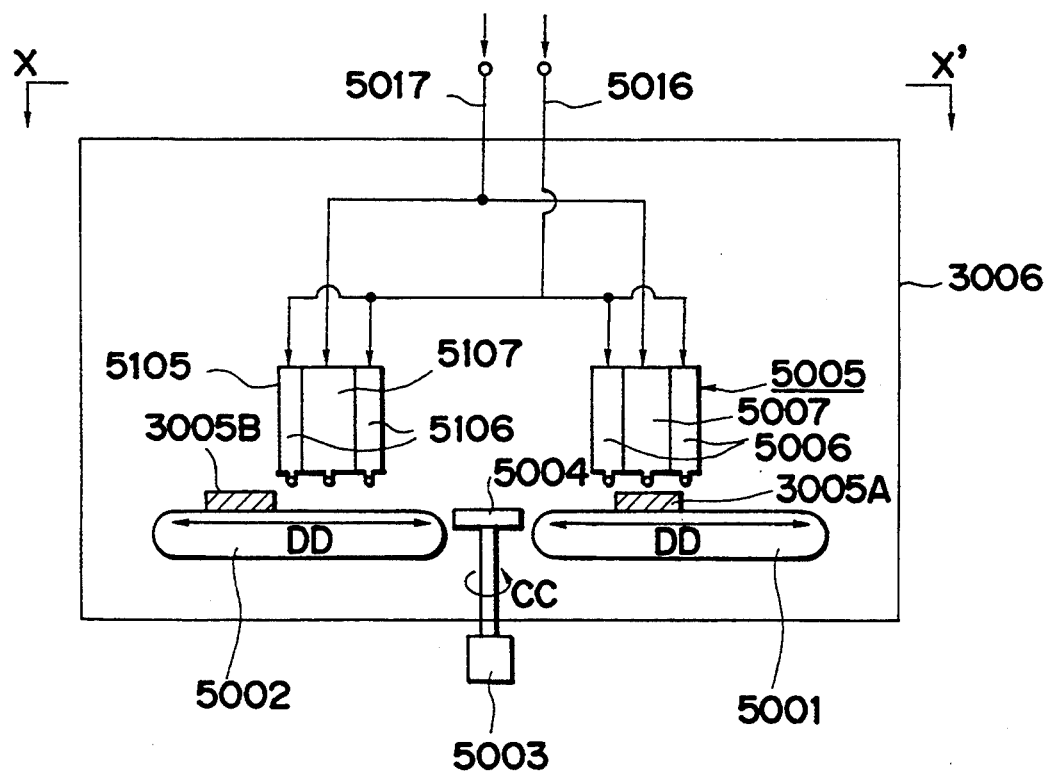
FIG. 17 is a view along the line X—X' in FIG. 16.
Figure 18:
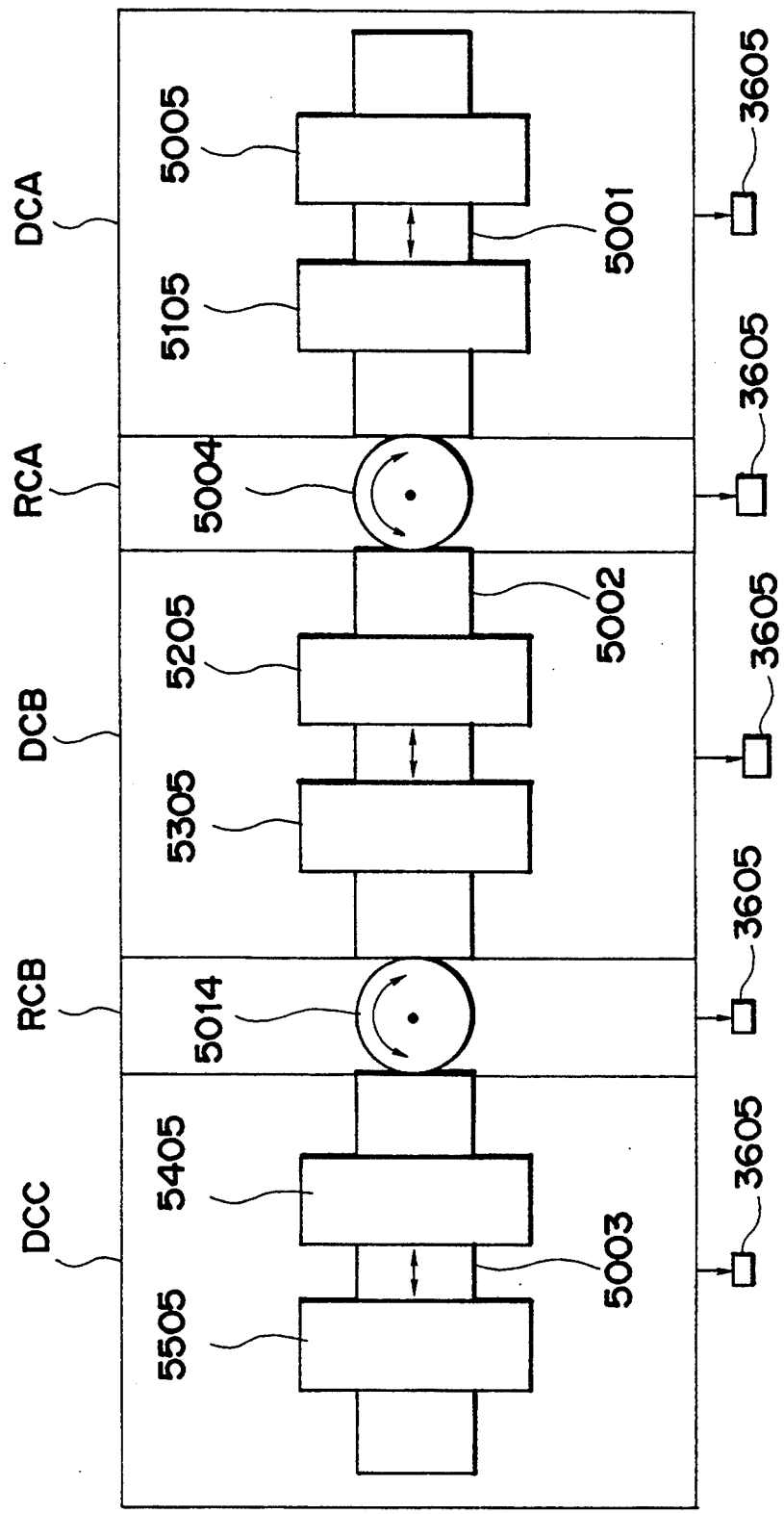
FIG. 18 is a diagrammatic illustration of a modification of Example 5.

FIGS. 16 to 18 are diagrammatic illustrations of CVD apparatus according to Example 5 of the present invention.

FIG. 17 is a cross-sectional view along the line X—X' in FIG. 16. In FIG. 17, reference numeral 3006 denotes a reaction chamber provided therein with a substrate holder 5001 that holds a substrate 3005A in the manner reciprocatingly movable in the direction of an arrow DD and another substrate holder 5002 that holds a substrate 3005B in the manner similarly movable in the direction of an arrow DD, which holders are opposingly provided interposing an intermediating turn table 5004 between them.

Heads 5005 and 5105 are respectively provided above the holders 5001 and 5002, which respectively comprise first gas head assemblies 5007 and 5107 and second gas head assemblies 5006 and 5106.

For example, a material gas such as DMAH is fed into the first gas head assemblies 5007 and 5107 through a pipe 5017 and a reaction gas such as hydrogen is fed into the second gas head assemblies 5006 and 5106 through a pipe 5016. In the case when the gases are fed into the reaction chamber in the form of a mixed gas, the head assemblies and pipes may be unified.

The present CVD apparatus is operated as described below.

First, the substrate having been subjected to film formation on the holder 5001 while being reciprocated beneath the head 5005 is subsequently moved onto the turn table 5004. The turn table is turned by 180° by means of a motor 5003. Of course, it may be turned by any angle except 360° or 0°, and preferably 30° to 330°, and more preferably 30° to 210°.

Next, the substrate having been moved onto the holder 5002 is again subjected to film formation while being reciprocated similarly. These steps are carried out in the same reaction chamber 3006. Hence, with reference to FIG. 16, the right region A (5005A) of the substrate at the initial film formation corresponds to the left region B (5005B) at the subsequent film formation. Since the rate of film formation is determined by the flow rate of the starting gas in the case of DMAH or TiBA, the film formation should preferably be carried out independently in two or more film formation regions as in the present Example.

When the substrate is moved, there is a possibility that the film thickness becomes uneven substantially in parallel to the direction of movement. Now, in the present Example, the substrate is turned by the angle except 0° and 360° within the deposition area by means of the intermediating means having the turn table, and then the subsequent film formation is carried out. Hence, uniform films can be stably obtained.

FIG. 18 illustrates a modified embodiment of the present Example. Its film forming system is comprised of six heads 5005, 5105, 5205, 5305, 5405 and 5505, three holders 5001, 5002 and 5003 and two turn tables 5004 and 5014.

First, in a first film forming chamber DCA, the substrate is subjected to film formation on the holder 5001 while being reciprocated beneath the heads 5005 and 5105. Next, the substrate having been moved to a first intermediating chamber RCA is turned by 60° on the turn table 5004, and then moved to a next, second film forming chamber DCB. Film formation is also carried out here in the same manner as in the first film forming chamber DCA. Thereafter, the substrate is further turned by 60° in a second intermediating chamber RCB, and then moved in a third film forming chamber DCC, where the film formation is again carried out.

Each chamber can be independently evacuated by means of an exhaust system 3605 so as to be isolated from the atmosphere. Gate valves (not shown) are also provided between chambers so that the film forming atmosphere can be independently maintained for each chamber.

Of course, including the turn tables, all the heads and substrate holders may be provided in a common chamber as shown in FIG. 16.

In order to improve mass-productivity, however, the multi-chamber system as shown in FIG. 18 should be taken and film formation is carried out in such a way that at least one substrate is always present in each film forming chamber.

Needless to say, the head in Example 4 may be employed in the heads 5005 and so on and, as the gas feeding system, the one used in Example 1 may be employed.

The present Example, in which the substrates are turned during the film formation, makes it possible to obtain uniform films with regularity and without unevenness.

EXPERIMENT 1

Using the apparatus of Example 1, deposition of Al was carried out under typical conditions of a hydrogen flow rate of 500 sccm, a DMAH flow rate of 50 sccm, a reaction chamber pressure of 1.2 Torr and a substrate heating temperature of 270° C. to form a metal film. As a result, the metal film obtained was an aluminum thin film with an excellent flatness and film quality.

EXPERIMENT 2

On the substrate having the Al film obtained in Experiment 1, a silicon oxide film was formed using the CVD apparatus having the same constitution as in Example 1.

A silicon oxide film of about 1 $\mu$m thick was formed using TEOS as a starting material and ozone ($O_3$) as a reaction gas. The silicon oxide film obtained well covered the step portion and was flat.

EXPERIMENT 3

An aluminum thin film was formed using the apparatus of Example 2 described above and Using TIBA as a source material and Ar as a carrier gas. As a result, the scope of conditions suited for film formation expanded in respect of the flow rate of the starting gas and the temperature of the gas feeding assembly, a good reproducibility was achieved, and it was possible to well feed the starting gas.

An improvement was also seen in the film quality (surface roughness, specific resistivity, etc.) on the substrate. In particular, temperature was well controllable at the initial stage of the growth of film, i.e., immediately after the feeding of gas and hence the Al film was well formed on the substrate having step portion.

In conventional gas rectifiers, a temperature distribution has caused local deposition of Al films on the rectifier or abnormal growth of products. According to this experiment, however, it became possible to better prevent such unauthorized deposition on the gas feeding assembly and to extend the maintenance period.

EXPERIMENT 4

Aluminum thin films were formed using the apparatus of Example 2 and using dimethylaluminum hydride (DMAH) as a starting material and $H_2$ as a carrier gas. Here, the temperature of the gas feeding assembly was set at 80° C. and controlled for each of the plurality of heating rectifying plates (three plates in this experiment). This was done to eliminate the influence of radiation heat coming from the substrate holder and to control the temperature low enough to prevent decomposition of the DMAH, as previously stated. Here, the substrate was heated at temperatures of 250° C. to 300° C. The individual control made it possible to control the temperature of the rectifying plates at 100° C. or below even with respect to the DMAH decomposing at a relatively low temperature, about 160° C., and contributed to improvements in the rate of film deposition and the reproducibility of film quality.

EXPERIMENT 5

In the same apparatus as used in Experiment 4, the three rectifying plates were made to have a temperature gradient of from 10° to 40° C. from the gas feed side toward the substrate side (e.g., the gas feed side was set at 60° C., the center at 75° C. and the substrate side at 90° C.). In this way the selective deposition of Al was carried out. In this experiment, it was possible to prevent occurrence of the undesirable condensation of saturated vapor of the starting material into a liquid, caused by local supercooling of the vapor when it flows, and it became possible to feed the starting material in a high efficiency. The rate of deposition of the film thus obtained was about 1 $\mu$m/min.

In another example, the rectifying plates of the gas feeding assembly may be increased to 5 to 6 plates to provide a multiple structure, where the temperature is controlled for each plate. This makes it possible to bring the gas into a good vaporized state when it is fed into the reaction chamber through the final heating rectifying plate, even if the starting gas fed to the gas feeding assembly is in a supersaturated stated or contains liquid droplets. This brings about an improvement in feed efficiency of the starting material and an improvement in the film deposition rate.

In the above embodiments, the feeding of starting gas has been described with reference to thermal CVD apparatus. The present invention can be very useful also in apparatus for other CVD such as plasma CVD, as a method of feeding starting materials comprised of organometallic compounds.

What is claimed is:

1. A starting gas feeding apparatus for forming a gaseous starting material from a liquid starting material and feeding said gaseous starting material into a reaction chamber of a CVD apparatus, comprising;
    a container that holds said liquid starting material, pressure reducing means for reducing the pressure inside said container, and heating means for heating said liquid starting material, thereby boiling said liquid starting material.

2. A CVD apparatus comprising:
    a reaction chamber, exhaust means for evacuating the inside of said reaction chamber, substrate supporting means for supporting a substrate in said reaction chamber, and a gas feeding means for feeding a gaseous starting material into said reaction chamber, wherein;
    said gas feeding means comprises a container that holds said liquid starting material, pressure reducing means that reduces the pressure inside said container, and heating means for heating said starting material, thereby boiling said liquid starting material to form said gaseous starting material.

3. The CVD apparatus according to claim 2, wherein said starting material comprises an organometallic compound.

4. A CVD apparatus for feeding a starting gas into a reaction chamber with starting gas feeding means and depositing a thin film on a substrate placed in said reaction chamber, wherein;
    said starting gas feeding means comprises a heating apparatus, said heating apparatus comprising a plate member integrally providing a plurality of through-holes through which a starting gas is passed and a heater in the vicinity of said through-holes, said gas feeding means further comprising temperature control means that controls the temperature of said heater, wherein said starting gas is fed into said reaction chamber through said through-holes.

5. The CVD apparatus according to claim 4, wherein said starting gas comprises an organometallic compound.

6. A CVD apparatus comprising a container that holds a liquid starting material, a mixing chamber in which a gas of said starting material and other gas are mixed, a rectifier provided between said container and said mixing chamber; said rectifier being provided with a gas feeding means comprising a plate member provided with an opening having heating means.

7. A CVD apparatus comprising a head from which a starting gas is liberated toward a substrate placed in a reaction chamber; said head having a gas liberating surface at a distance of 10 mm or less from the surface of said substrate, and said gas liberating surface being detachably supported.

8. The CVD apparatus according to claim 7, wherein the head is a head assembly provided with a plurality of plate members each having openings for passing through gas.

9. A CVD apparatus for forming a deposited film comprised of the same material in a plurality of film forming regions, wherein;
    said plurality of film forming regions are provided between them with means for turning a substrate, the substrate on which a film has been formed in one of said film forming regions is turned by an angle within the range of larger than 0° to smaller than 360°, and thereafter said substrate is placed in other film forming region to further form a film.

* * * * *

UNITED STATES PATENT AND TRADEMARK OFFICE
CERTIFICATE OF CORRECTION

PATENT NO. : 5,447,568

DATED : September 5, 1995

INVENTOR(S) : Hayakawa et al.

Page 1 of 9

It is certified that error appears in the above-identified patent and that said Letters Patent is hereby corrected as shown below:

COLUMN 1

Line 18, "using" should read --using appropriate--.
Line 21, "Of these" should read --In-- and "of the" should read --of--.
Line 23, "less faults are" should read --fewer faults is-- and "the" should be deleted.
Line 24, "are" should read --are also-- and "as a matter of course" should be deleted.
Line 25, "besides" should be deleted.
Line 26, "portion" should read --portions--.
Line 30, "of the" should read --of--.
Line 32, "portion" should read --portions--.
Line 34, "ICs and in" should read --Ics.  In--.
Line 35, "portion" should read --portions--.
Line 40, "such" should read --a prior art--.
Line 42, "therein" should read --with--.
Line 47, "comprise" should read --comprised--.
Line 48, "rotary pump" should read --rotary pump.--
Line 49, "and from which" should read --The pumps are used to evacuate-- and "chamber 403" should read --chamber 403.--.
Line 50, should be deleted.
Line 51, "it is provided with" should be deleted.
Line 56, "chamber 403." should read --chamber 403 are provided.--.

UNITED STATES PATENT AND TRADEMARK OFFICE
CERTIFICATE OF CORRECTION

PATENT NO. : 5,447,568

DATED : September 5, 1995

INVENTOR(S) : Hayakawa et al.

It is certified that error appears in the above-identified patent and that said Letters Patent is hereby corrected as shown below:

```
Line 57, "make full" should read --be used--.
Line 58, "use of its performance" should be deleted and
      "common" should read --routine--.
Line 59, "but" should read --but it-- and "for a" should be
         deleted.
Line 60, "CVD method that can excellently" should read
      --to--.
Line 61, "or" should read --or to--.
Line 62, "have had some" should be deleted.
Line 63, "features that they" should be deleted and
      "general-purpose proper-" should read --multi-purpose
      uses,--.
Line 64, "ties," should be deleted.
```

COLUMN 2

```
Line 3,  "nowadays" should be deleted.
Line 4,  "greatly differ" should read --differ greatly--.
Line 5,  "conductor and hence" should read --conductor.
      Hence--.
Line 6,  "in which" should read --where--.
Line 9,  "in instances" should read --when--.
Line 10, "in which" should be deleted.
Line 12, "the" should be deleted.
Line 13, "sputtering" should read --sputtering,-- and "the"
         should be deleted.
```

UNITED STATES PATENT AND TRADEMARK OFFICE
CERTIFICATE OF CORRECTION

PATENT NO. : 5,447,568

DATED : September 5, 1995

INVENTOR(S) : Hayakawa et al.

Page 3 of 9

It is certified that error appears in the above-identified patent and that said Letters Patent is hereby corrected as shown below:

```
Line 25, "the" should be deleted.
Line 26, "in the" should read --in--.
Line 55, "a change in apparatus environment such"
      should read --difficulties have been encountered in
      scaling up--.
Line 56, "that an" should read --an--.
Line 57, "the" should be deleted and "is made up" should
      be deleted.
Line 58, "apparatus has caused the problem that" should
      read --apparatus.--.
Line 60 should be deleted
Line 66, "is" should read --are--.
Line 67 should be deleted.
Line 68, "apparatus." should read --apparatus, as
      follows:--.
```

COLUMN 3

```
Line 8, "compound." should read --compounds.--.
Line 13, "form" should read --form good quality-- and
      "with a good quality" should be deleted.
Line 19, "promises the reduction of" should read --reduces--
      and "cost of various" should read --cost.--.
Line 20 should be deleted.
Line 51, "still" should be deleted.
Line 55, "other" should read --another--.
```

UNITED STATES PATENT AND TRADEMARK OFFICE
CERTIFICATE OF CORRECTION

PATENT NO. : 5,447,568

DATED : September 5, 1995

INVENTOR(S): Hayakawa et al.

It is certified that error appears in the above-identified patent and that said Letters Patent is hereby corrected as shown below:

COLUMN 4

Line 8, "other" should read --another--.
Line 15, "formed." should read --being formed.--.
Line 56, "specific description of" should read --describing--.

COLUMN 5

Line 10, "condition" should read --conditions--.
Line 11, "contemplate that" should read --consider using an excess of hydrogen.--.
Line 12, "hydrogen may be mixed in excess. The feeding of" should read --Using--.
Line 13, "to" should read --up to-- and "brings about the" should read --causes--.
Line 14, "problems that" should read --problems, such as--.
Line 15, "that" should be deleted.
Line 17, "After all, appropriate" should read --Appropriate--.
Line 18, "indispensable" should read --critical--.
Line 19, "Lead to a commercial success" should read --be used commercially--.
Line 43, "control" should read --make--.

UNITED STATES PATENT AND TRADEMARK OFFICE
CERTIFICATE OF CORRECTION

PATENT NO. : 5,447,568

DATED : September 5, 1995

INVENTOR(S) : Hayakawa et al.

It is certified that error appears in the above-identified patent and that said Letters Patent is hereby corrected as shown below:

Line 44, "several times," should read --several-fold,-- and "comes" should read --can--.
Line 45, "to" should be deleted.
Line 46, "in" should read --on--.
Line 47, "any" should read --any currently available-- and "on" should be deleted.
Line 48, "the present technical level" should be deleted.
Line 58, "of" should read --in--.
Line 60, "changes of" should read --changes in--.
Line 62, "the the" should read --the--.

COLUMN 6

Line 19, "have a satisfactory" should read --control satisfactorily the-- and "controllability for the" should read --to achieve--.
Line 20, "achievement of wide" should be deleted.
Line 24, "by the" should read --by an-- and "compound" should read --compound,--.
Line 50, "a use" should read --the--.

UNITED STATES PATENT AND TRADEMARK OFFICE
CERTIFICATE OF CORRECTION

PATENT NO. : 5,447,568

DATED : September 5, 1995

INVENTOR(S): Hayakawa et al.

It is certified that error appears in the above-identified patent and that said Letters Patent is hereby corrected as shown below:

COLUMN 7

Line 13, "used." should read --made.--.
Line 29, "of" should read --or--.
Line 55, "well" should be deleted.

COLUMN 8

Line 2, "comes to be held" should read --is filled--.
Line 3, "gas" should read --the gas-- and "comes to be" should read --is--.
Line 7, "is pressure" should read --its pressure--.
Line 46, "A means by" should be deleted.
Line 47, "which the deposition is" should read --Deposition can be-- and "therein" should be deleted.
Line 48, "becomes too short and its" should be deleted and "lower than a cer-" should read --too low using a means--.
Line 49, "tain level is" should be deleted.
Line 52, "for preventing overheat" should read --to prevent overheating--.

UNITED STATES PATENT AND TRADEMARK OFFICE
CERTIFICATE OF CORRECTION

PATENT NO. : 5,447,568

DATED : September 5, 1995

INVENTOR(S) : Hayakawa et al.

It is certified that error appears in the above-identified patent and that said Letters Patent is hereby corrected as shown below:

COLUMN 9

Line 19, "gas" should read --gases--.
Line 65, "denotes" should read --denote--.

COLUMN 10

Line 55, "to cause" should read --and causes--.
Line 57, "can not be" should read --is not--.
Line 64, "precisely made" should read --precise-- and "is being" should be deleted.
Line 65, "flowed." should read --flows.--.

COLUMN 11

Line 2, "is" should read --does--.
Line 3, "flowed" should read --flow--.
Line 5, "is being flowed" should read --flows-- and "operated" should read --operative--.
Line 11, "is dropped" should read --drops--.
Line 16, "plate is," should read --plate,--.

UNITED STATES PATENT AND TRADEMARK OFFICE
CERTIFICATE OF CORRECTION

PATENT NO. : 5,447,568

DATED : September 5, 1995

INVENTOR(S) : Hayakawa et al.

Page 8 of 9

It is certified that error appears in the above-identified patent and that said Letters Patent is hereby corrected as shown below:

COLUMN 12

```
Line 3,  "is" should be deleted.
Line 52, "control" should read --controls--.
Line 58, "as" should read --like--.
Line 59, "in the" should be deleted.
Line 62, "diagrammatical" should read
         --diagrammatic--.
```

COLUMN 13

```
Line 21, "little" should be deleted.
Line 39, "in the manner" should be deleted.
```

COLUMN 14

```
Line 4,  "mienders" should read --flows--.
Line 61, "an intermediating" should read --a--.
```

COLUMN 16

```
Line 30, "Using" should read --using--.
```

UNITED STATES PATENT AND TRADEMARK OFFICE
CERTIFICATE OF CORRECTION

PATENT NO. : 5,447,568

DATED : September 5, 1995

INVENTOR(S) : Hayakawa et al.

It is certified that error appears in the above-identified patent and that said Letters Patent is hereby corrected as shown below:

<u>COLUMN 17</u>

Line 20, "good" should read --well--.
Line 23, "stated" should read --state--.

<u>COLUMN 18</u>

Line 26, "other" should read --another--.
Line 51, "other" should read --another--.

Signed and Sealed this

Eighteenth Day of June, 1996

Attest:

BRUCE LEHMAN

Attesting Officer        Commissioner of Patents and Trademarks